(12) United States Patent
Jang et al.

(10) Patent No.: US 11,385,674 B2
(45) Date of Patent: Jul. 12, 2022

(54) CLOCK DISTRIBUTION CIRCUIT AND SEMICONDUCTOR DEVICE INCLUDING THE CLOCK DISTRIBUTION CIRCUIT

(71) Applicant: SK hynix Inc., Icheon-si (KR)

(72) Inventors: Soo Young Jang, Seoul (KR); Dae Han Kwon, Seoul (KR); Geun Il Lee, Yongin-si (KR); Kyu Dong Hwang, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 25 days.

(21) Appl. No.: 16/890,717

(22) Filed: Jun. 2, 2020

(65) Prior Publication Data

US 2020/0293082 A1 Sep. 17, 2020

Related U.S. Application Data

(63) Continuation-in-part of application No. 16/104,776, filed on Aug. 17, 2018, now abandoned.

(30) Foreign Application Priority Data

Feb. 9, 2018 (KR) .................... 10-2018-0016550

(51) Int. Cl.
  *G06F 1/10* (2006.01)
  *H03K 19/0185* (2006.01)
  *H03L 7/189* (2006.01)

(52) U.S. Cl.
  CPC ....... *G06F 1/10* (2013.01); *H03K 19/018521* (2013.01); *H03L 7/189* (2013.01)

(58) Field of Classification Search
  CPC .... G06F 1/10; H03K 19/018521; H03L 7/189
  See application file for complete search history.

(56) References Cited

U.S. PATENT DOCUMENTS

| | | | |
|---|---|---|---|
| 7,436,232 B2 | 10/2008 | Sivero et al. | |
| 7,888,991 B2 | 2/2011 | Lin | |
| 8,198,930 B2 | 6/2012 | Zerbe et al. | |
| 8,289,257 B1 | 10/2012 | Simon | |
| 9,973,191 B2 | 5/2018 | Klass | |
| 2003/0037271 A1 | 2/2003 | Liu et al. | |
| 2006/0291110 A1 | 12/2006 | Kanno et al. | |
| 2008/0084237 A1 | 4/2008 | Behrends et al. | |
| 2009/0303827 A1* | 12/2009 | Kim ...................... | G11C 7/225 365/233.1 |
| 2010/0237925 A1* | 9/2010 | Lin .................... | H03K 3/35613 327/299 |

(Continued)

*Primary Examiner* — Metasebia T Retebo
(74) *Attorney, Agent, or Firm* — William Park & Associates Ltd.

(57) ABSTRACT

A clock distribution circuit may include a data clock generation circuit configured to be input a power source voltage and configured to generate an internal clock signal according to an external clock signal; and a global distribution circuit includes a first circuit and a second circuit coupled to a global line, configured to be input a power source voltage and configured to receive the internal clock signal through the first circuit and distribute the internal clock signal to an exterior of the clock distribution circuit through the second circuit, wherein a first bias voltage provided to the first circuit and a second bias voltage provided to the second circuit are controlled independently of each other.

19 Claims, 7 Drawing Sheets

(56) References Cited

U.S. PATENT DOCUMENTS

| | | | |
|---|---|---|---|
| 2010/0329041 A1* | 12/2010 | Sohn | G11C 7/1084 365/189.05 |
| 2015/0048873 A1* | 2/2015 | Kumar | G06F 1/10 327/293 |
| 2017/0053684 A1 | 2/2017 | Choi | |

* cited by examiner

CLOCK DISTRIBUTION CIRCUIT AND SEMICONDUCTOR DEVICE INCLUDING THE CLOCK DISTRIBUTION CIRCUIT

CROSS-REFERENCES TO RELATED APPLICATION

The present application is a continuation-in-part application of U.S. patent application Ser. No. 16/104,776, filed on Aug. 17, 2018, and claims priority under 35 U.S.C. § 119(a) to Korean application number 10-2018-0016550, filed on Feb. 9, 2018, in the Korean Intellectual Property Office, which is incorporated herein by reference in its entirety.

BACKGROUND

1. Technical Field

Various embodiments generally relate to a semiconductor device, and more particularly, to a clock distribution circuit and a semiconductor device including the clock distribution circuit.

2. Related Art

A semiconductor device includes a clock distribution circuit for distributing an external clock signal to various internal circuits, the external clock signal including a clock signal provided from a host.

The clock distribution circuit includes logic circuits for receiving the external clock signal and processing or retransmitting the received clock signal such that the clock signal can be used in the internal circuits, and the logic circuits may be operated according to a bias voltage.

Therefore, in order to raise the operation efficiency and performance of the semiconductor device, the level of the bias voltage provided to the logic circuits needs to be efficiently controlled.

SUMMARY

In an embodiment, a clock distribution circuit may be provided. The clock distribution circuit may include a data clock generation circuit configured to be input a power source voltage and configured to generate an internal clock signal according to an external clock signal; and a global distribution circuit includes a first circuit and a second circuit coupled to a global line, configured to be input a power source voltage and configured to receive the internal clock signal through the first circuit and distribute the internal clock signal to an exterior of the clock distribution circuit through the second circuit, wherein a first bias voltage provided to the first circuit and a second bias voltage provided to the second circuit are controlled independently of each other.

In an embodiment, a semiconductor device may be provided. The semiconductor device may include a clock distribution circuit including first and second circuits, configured to be input a power source voltage and configured to distribute an internal clock signal to global lines, the internal clock signal being generated based on an external clock signal; a plurality of DQ arrays; and a plurality of local networks configured to be input the power source voltage and configured to distribute the internal clock signal transmitted through the global lines to the plurality of DQ arrays, wherein a second bias voltage is provided to the second circuit directly coupled to the global lines, and a first bias voltage is provided to the first circuit coupled to the second circuit, and wherein the first and second bias voltages are controlled independently of each other

DETAILED DESCRIPTION

Hereinafter, a clock distribution circuit and a semiconductor device including the clock distribution circuit according to the present disclosure will be described below with reference to the accompanying drawings through examples of embodiments.

Various embodiments may be directed to a clock distribution circuit capable of efficiently controlling a bias voltage and a semiconductor device including the same.

Figure 1:
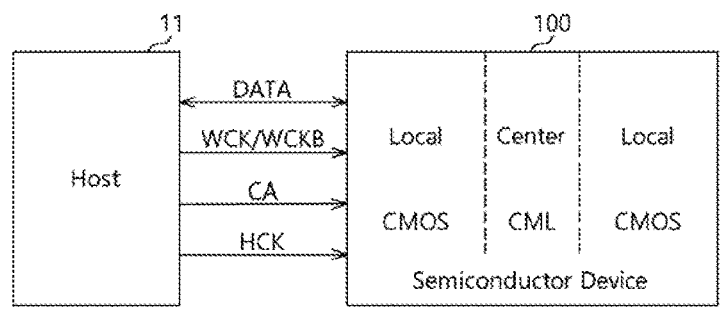
FIG. 1 illustrates the configuration of a data processing system in accordance with an embodiment.

FIG. 1 illustrates the configuration of a data processing system in accordance with an embodiment.

Referring to FIG. 1, the data processing system 10 in accordance with an embodiment may include a host 11 and a semiconductor device 100.

The host 11 may provide clock signals HCK and WCK/WCKB and a command and address signal CA to the semiconductor device 100, and perform data communication with the semiconductor device 100.

Hereafter, the clock signals HCK and WCK/WCKB will be referred to as external clock signals based on the semiconductor device 100.

The host 11 may include a memory controller such as a central processing unit (CPU) or graphic processing unit (GPU), for example.

The first external clock signal HCK, which is a clock signal related to the command and address signal CA, may be used as a reference signal when the semiconductor device 100 receives the command and address signal CA.

The second external clock signal WCK/WCKB is a clock signal related to data DATA. In an embodiment, a differential clock signal may be used, but a single phase clock signal can be used. The second external clock signal WCK/WCKB may be used as a reference signal when the semiconductor device 100 receives the data DATA.

The second external clock signal WCK/WCKB may have a higher frequency than the first external clock signal HCK.

The second external clock signal WCK/WCKB may have a frequency of 8 GHz, for example, but the first external clock signal HCK may have a lower frequency than the second external clock signal WCK/WCKB, for example, a frequency of 1 GHz.

The semiconductor device 100 may include a memory apparatus such as a graphic memory, for example.

Logic circuits may be divided into current mode logic (CML) circuits and complementary metal-oxide semiconductor (CMOS) circuits, depending on their signal processing methods.

The regions of the semiconductor device 100 may be divided into a first region in which the CML circuits are arranged and a second region in which the CMOS circuits are arranged.

For convenience of description, the regions of the semiconductor device 100 may be divided into a center region and local regions. The center region may correspond to the first region, and the local regions may correspond to the second region.

The circuits of the center region may be maintained in an active state regardless of a read/write operation of the semiconductor device.

However, a part of CML-level clock signals may be partially deactivated according to a power down mode or a command such as a refresh command.

The circuits of the local region may be enabled or disabled to according to a read/write operation of the semiconductor device.

Each of the CML circuits of the center region transfers a signal inputted thereto to another CML circuit closer to the CML circuit than the local regions, but each of the CMOS circuits of the local regions needs to receive a signal processed at the CML level in the center region through a global line having larger loading than an internal signal line of the center region, and convert the received signal into the CMOS level.

Therefore, when the bias voltages of circuits which transfer signals to the circuits of the local regions through the global line, among the circuits of the center region, are controlled to the same level as the other circuits of the center region, the clock signaling characteristic of the semiconductor device may be degraded.

Furthermore, when the bias voltages of circuits which transfer signals to other circuits of the center region, among the circuits of the center region, are set to the same level as the bias voltages of circuits which directly transfer signals to the circuits of the local region, power efficiency may be reduced by unnecessary power consumption.

The clock distribution circuit of the semiconductor device in accordance with an embodiment may be configured to independently control the bias voltages of a part of the circuits, for example, the circuits which transfer signals to the local regions through the global line, among the circuits of the center region, and the bias voltages of the other circuits.

Figure 2:
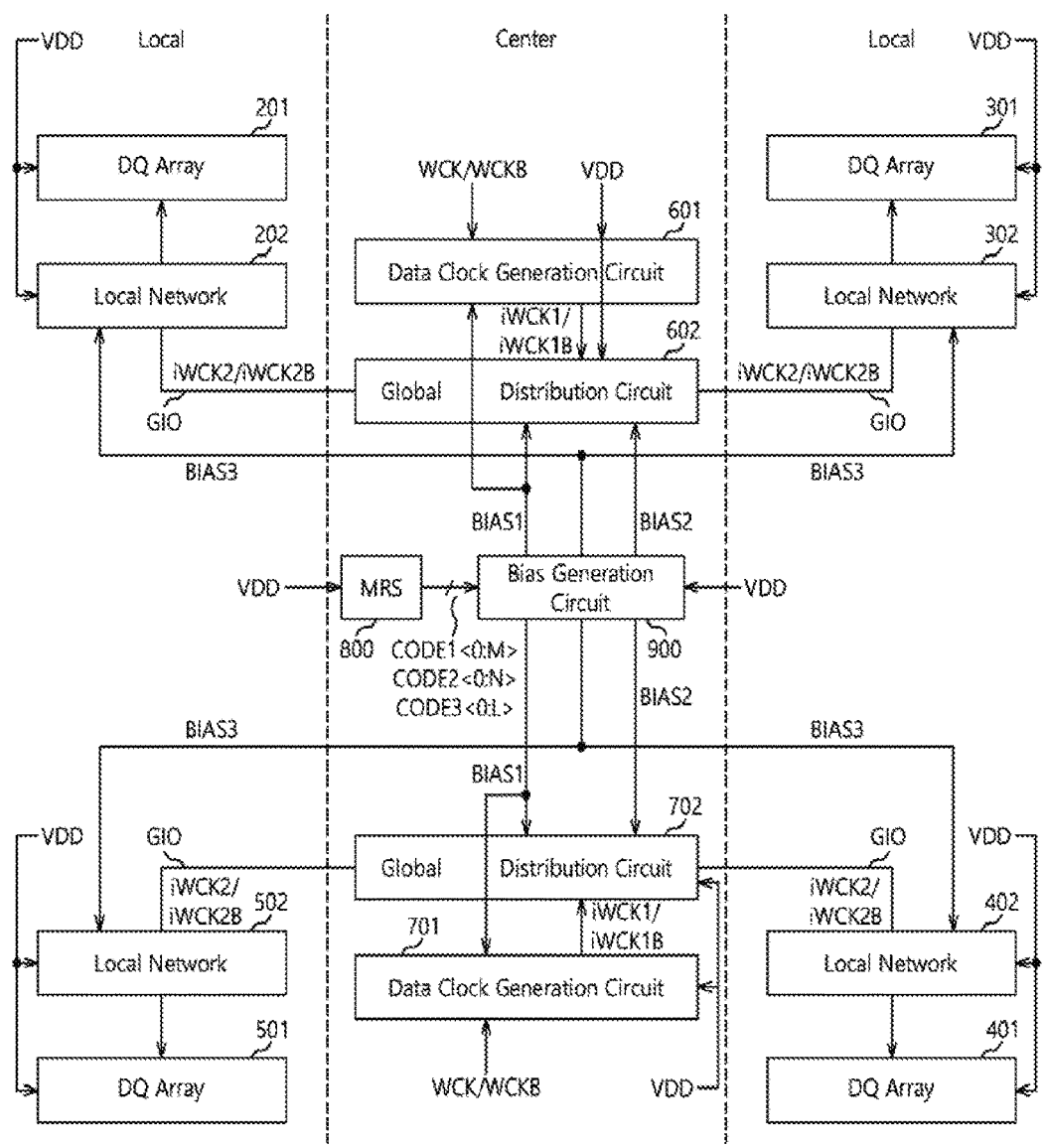
FIG. 2 illustrates the configuration of a semiconductor device including a clock distribution circuit in accordance with an embodiment.

FIG. 2 illustrates the configuration of a semiconductor device including a clock distribution circuit in accordance with an embodiment.

Referring to FIG. 2, the semiconductor device 100 in accordance with an embodiment may include a plurality of DQ arrays 201, 301, 401 and 501, a plurality of local networks 202, 302, 402 and 502, a plurality of data clock generation circuits 601 and 701, a plurality of global distribution circuits 602 and 702, a mode register set (MRS) 800 and a bias generation circuit 900.

The clock distribution circuit in accordance with an embodiment may include the plurality of data clock generation circuits 601 and 701, the plurality of global distribution circuits 602 and 702 and the bias generation circuit 900.

A power supply voltage VDD is applied to the plurality of DQ arrays 201, 301, 401 and 501.

The power supply voltage VDD and a third bias voltage BIAS3 are applied to the plurality of local networks 202, 302, 402 and 502.

The power supply voltage VDD and a first bias voltage BIAS1 are applied to the plurality of data clock generation circuits 601 and 701.

The power supply voltage VDD, the first bias voltage BIAS1 and a second bias voltage BIAS2 are applied to the plurality of global distribution circuits 602 and 702.

The power supply voltage VDD is applied to the mode register set 800 and the bias generation circuit 900.

The plurality of DQ arrays 201, 301, 401 and 501 and the plurality of local networks 202, 302, 402 and 502 may be arranged in the local region.

The plurality of data clock generation circuits 601 and 701, the plurality of global distribution circuits 602 and 702, the MRS 800 and the bias generation circuit 900 may be arranged in the center region.

The configuration in which the MRS 800 and the bias generation circuit 900 are arranged in the center region is only an example, and the MRS 800 and the bias generation circuit 900 may be arranged in the local region.

The plurality of DQ arrays 201, 301, 401 and 501 may be configured in the same manner.

Each of the DQ arrays 201, 301, 401 and 501 may include a plurality of DQ circuits.

The DQ circuits, which are data input/output terminals of the semiconductor device 100, may include a pad, a receiver for receiving data through the pad, and a driver for driving data outputted from the semiconductor device to the pad.

The number of DQ circuits included in each of the DQ arrays 201, 301, 401 and 501 may be changed depending on the bandwidth option (X16 or X32) of the semiconductor device. The number of DQ circuits included in each of the DQ arrays 201, 301, 401 and 501 may be changed depending on the bandwidth option (X16 or X32) of the semiconductor device.

The plurality of local networks 202, 302, 402 and 502 may be configured in the same manner.

The plurality of local networks 202, 302, 402 and 502 may convert a second internal clock signal iWCK2/iWCK2B transmitted from the center region through the global line GIO to the CMOS level, and distribute the adjusted clock signal to the plurality of DQ arrays 201, 301, 401 and 501 according to the power supply voltage VDD.

The plurality of local networks 202, 302, 402 and 502 may control swing width of its own outputs according to a third bias voltage BIAS3.

The plurality of data clock generation circuits 601 and 701 may be configured in the same manner.

The plurality of data clock generation circuits 601 and 701 may generate a first internal clock signal iWCK1/iWCK1B using an external clock signal or a second external clock signal WCK/WCKB provided from the host 11, according to the power supply voltage VDD.

The plurality of data clock generation circuits 601 and 701 may control a swing width of the first internal clock signal iWCK1/iWCK1B according to the first bias voltage BIAS1.

The plurality of global distribution circuits 602 and 702 may be configured in the same manner.

The plurality of global distribution circuits 602 and 702 may generate the second internal clock signal iWCK2/ iWCK2B by driving the first internal clock signal iWCK1/iWCK1B according to the power supply voltage VDD, and may distribute the second internal clock signal iWCK2/iWCK2B to an exterior of the clock distribution circuit through the global line GIO.

The plurality of global distribution circuits 602 and 702 may control a swing width of one output of internal signals according to the first bias voltage BIAS1 and control a swing width of another output of the internal signals according to the second bias voltage BIAS2.

Each of the global distribution circuits 602 and 702 may provide the second bias voltage BIAS2 to a logic circuit which drives the second internal clock signal iWCK2/iWCK2B to the global line GIO, among internal logic circuits thereof, and provide the first bias voltage BIAS1 to the other logic circuits.

The MRS 800 may store and output a first bias code CODE1<0:M>, a second bias code CODE2<0:N> and a third bias code CODE3<0:L>.

The first bias code CODE1<0:M>, the second bias code CODE2<0:N> and the third bias code CODE3<0:L> may have specific initial values which can be varied.

The host 11 may independently adjust the values of the first bias code CODE1<0:M>, the second bias code CODE2<0:N> and the third bias code CODE3<0:L> by changing the settings of the MRS 800 using the command and address signal CA.

The bias generation circuit 900 may generate the first to third bias voltages BIAS1 to BIAS3 at independent levels, according to the first bias code CODE1<0:M>, the second bias code CODE2<0:N> and the third bias code CODE3<0:L> using the power supply voltage VDD.

The bias generation circuit 900 may generate the first bias voltage BIAS1 according to the first bias code CODE1<0:M>, generate the second bias voltage BIAS2 according to the second bias code CODE2<0:N>, and generate the third bias voltage BIAS3 according to the third bias code CODE2<0:L>.

Figure 3:
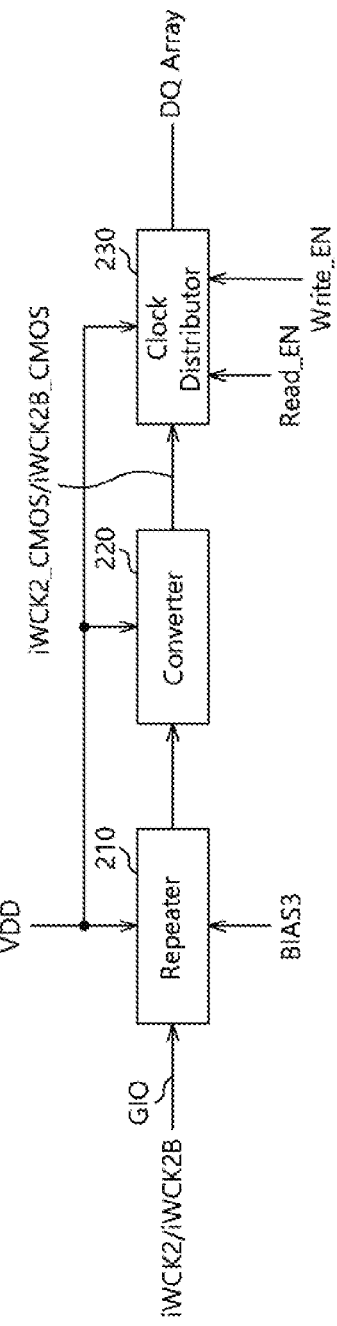
FIG. 3 illustrates the configuration of a local network of FIG. 2.

FIG. 3 illustrates the configuration of the local network of FIG. 2.

Since the plurality of local networks 202, 302, 402 and 502 are configured in the same manner, the configuration of one of the local networks 202, 302, 402 and 502 will be representatively described.

Referring to FIG. 3, the local network 202 may include a converter 220 and a clock distributor 230.

Since the second internal clock signal iWCK2/iWCK2B is transferred through the global line GIO, the signal characteristic may be reduced.

Therefore, the local network 202 may further include a repeater 210 for compensating for the reduction in signal characteristic of the second internal clock signal iWCK2/iWCK2B.

The repeater 210 may amplify the second internal dock signal iWCK2/iWCK2B according to the power supply voltage VDD, and retransmit the amplified signal.

The repeater 210 may control swing width of its own output according to the third bias BIAS3.

The converter 220 and the clock distributor 230 may be implemented with CMOS logic circuits.

The converter 220 may generate an output signal iWCK2_CMOS/iWCK2B_CMOS by converting the second internal clock signal iWCK2/iWCK2B transmitted at the CML level into the CMOS level.

The clock distributor 230 may distribute the output signal iWCK2_CMOS/iWCK2B_CMOS of the converter 220 to the DQ circuits of the DQ array 201 according to a read enable signal Read_EN and write enable signal Write_EN.

Figure 4:
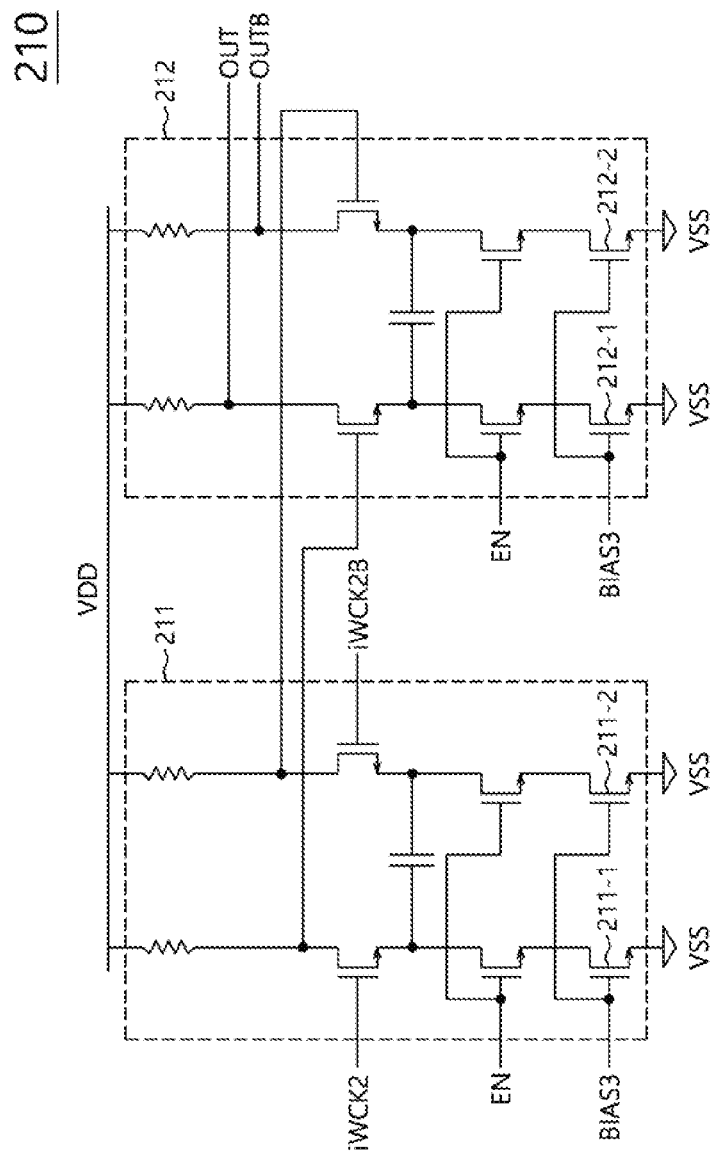
FIG. 4 illustrates the configuration of a repeater of FIG. 3.

FIG. 4 illustrates the configuration of the repeater of FIG. 3.

As illustrated in FIG. 4, the repeater may include a first amplification circuit 211 and a second amplification circuit 212.

The first amplification circuit 211 may amplify the second internal clock signal iWCK2/iWCK2B according to the power supply voltage VDD, and output the amplified signal.

The first amplification circuit 211 may be activated according to an enable signal EN.

The first amplification circuit 211 may control a swing width of its own output OUT/OUTB according to the third bias voltage BIAS3.

The first amplification circuit 211 may control the swing width of its own output applying the third bias voltage BIAS3 to gates of current sink transistors 211-1-211-2 coupled to a ground terminal.

The second amplification circuit 212 may amplify the output of the first amplification circuit 211 according to the power supply voltage VDD, and output the amplified signal.

The second amplification circuit 212 may be activated according to an enable signal EN.

The second amplification circuit 212 may control a swing width of its own output OUT/OUTB according to the third bias voltage BIAS3.

The second amplification circuit 212 may control the swing width of its own output OUT/OUTB by applying the third bias voltage BIAS3 to gates of current sink transistors 212-1-212-2 coupled to a ground terminal.

Figure 5:
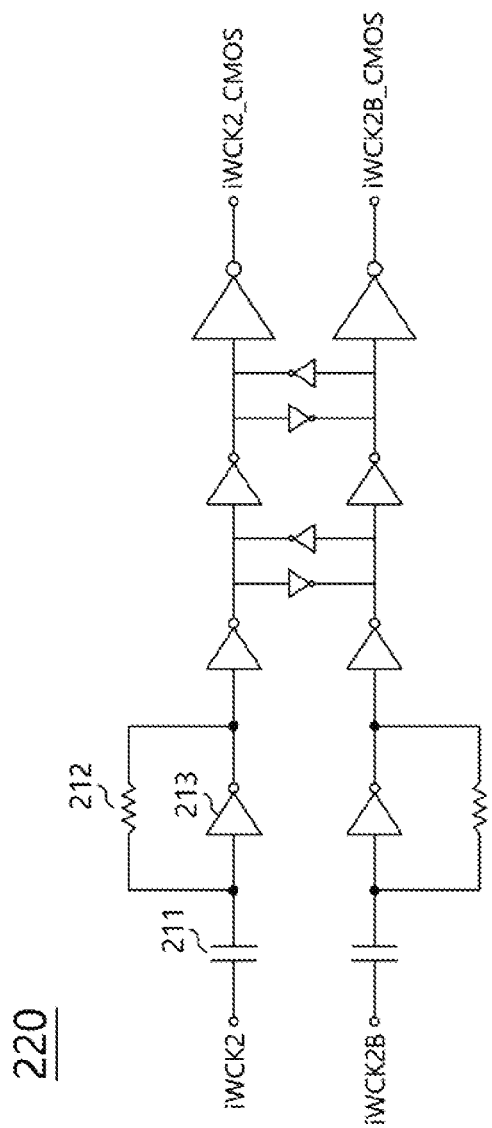
FIG. 5 illustrates the configuration of a converter of FIG. 3.

FIG. 5 illustrates the configuration of the converter of FIG. 3.

As illustrated in FIG. 5, the converter 220 may include a plurality of capacitors 211, a plurality of resistors 212 and a plurality of inverters 213, and generate the output signal iWCK2_CMOS/iWCK2B_CMOS by converting the second internal clock signal iWCK2/iWCK2B into the CMOS level.

Figure 6:
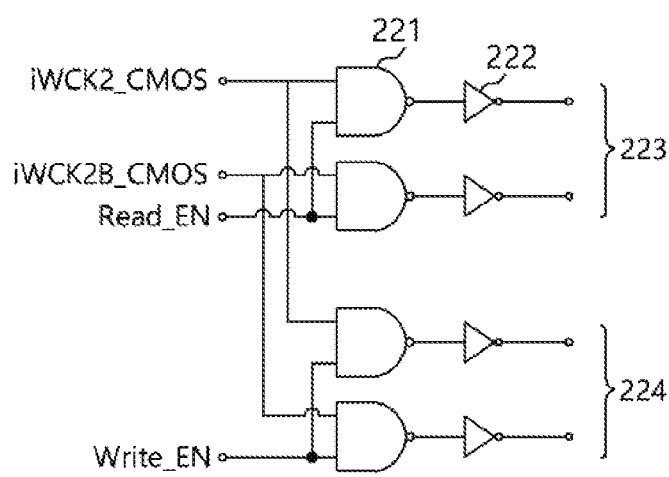
FIG. 6 illustrates the configuration of a clock distributor of FIG. 3.

FIG. 6 illustrates the configuration of the clock distributor of FIG. 3.

As illustrated in FIG. 6, the clock distributor 230 may include a plurality of NAND gates 221 and a plurality of inverters 222.

When the read enable signal Read_EN or the write enable signal Write_EN is activated, the clock distributor 230 may transmit the output signal iWCK2_CMOS/iWCK2B_CMOS of the converter 220 to the DQ circuits of the DQ array 201 through independent paths, that is, a first path 223 for a read operation and a second path 224 for a write operation.

Figure 7:
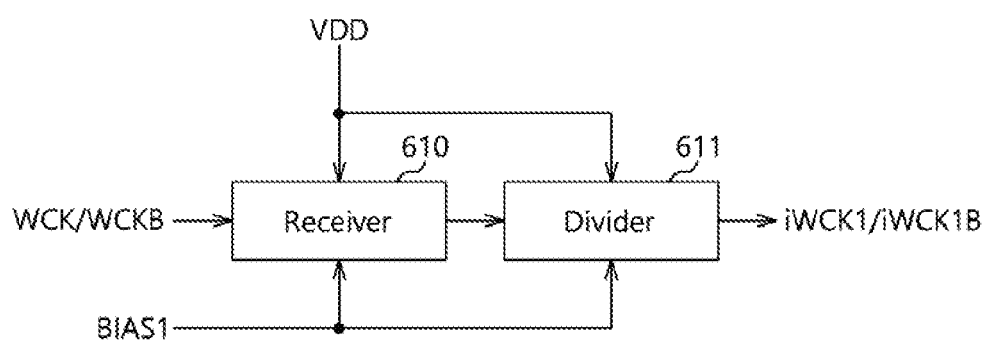
FIG. 7 illustrates the configuration of a data clock generation circuit of FIG. 2.

FIG. 7 illustrates the configuration of the data clock generation circuit of FIG. 2.

Since the plurality of data clock generation circuits 601 and 701 are configured in the same manner, the configuration of one of the data clock generation circuits 601 and 701 will be representatively described.

Referring to FIG. 6, the data clock generation circuit 601 may include a receiver 610 and a divider 611.

The receiver 610 and the divider 611 may be implemented with CML circuits.

The receiver 610 may receive an external clock signal WCK/WCKB according to the power supply voltage VDD, and output the received signal.

The receiver 610 may control a swing width of its own output according to the first bias voltage BIAS1.

The divider 611 may divide the output of the receiver 610 according to the power supply voltage VDD, and output the divided signal as the first internal clock signal iWCK1/iWCK1B.

The divider 611 may control a swing width of the first internal clock signal iWCK1/iWCK1B according to the first bias voltage BIAS1.

As described above, the external clock signal WCK/WCKB, which is a high-speed clock signal having a frequency of 8 GHz, for example, may have a timing margin which is not enough to be used for signal processing in the semiconductor device 100. Therefore, the clock distribution circuit in accordance with an embodiment may use the first internal clock signal iWCK1/iWCK1B obtained by dividing the external clock signal WCK/WCKB at a predetermined division ratio (for example, 1/2, 1/4 or 1/8).

Figure 8:
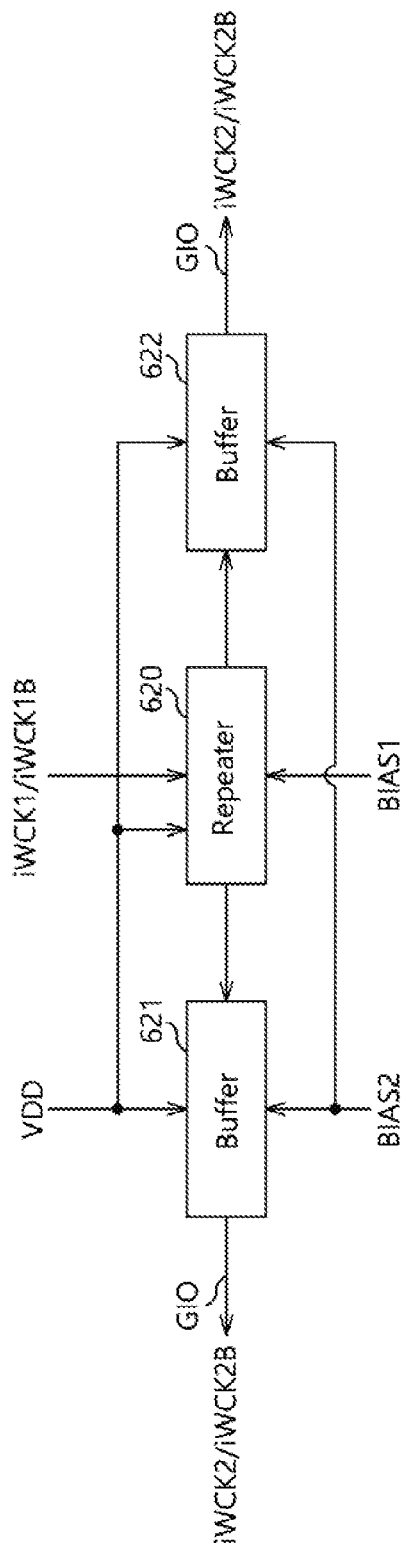
FIG. 8 illustrates the configuration of a global distribution circuit of FIG. 2.

FIG. 8 illustrates the configuration of the global distribution circuit of FIG. 2.

Since the plurality of global distribution circuits 602 and 702 are configured in the same manner, the configuration of one of the global distribution circuits 602 and 702 will be representatively described.

Referring to FIG. 8, the global distribution circuit 602 may include a repeater 620 and a plurality of buffers 621 and 622.

The repeater 620 and the plurality of buffers 621 and 622 may be implemented with CML circuits.

The repeater 620 may be configured on the same manner of the repeater 210 of FIG. 4.

The repeater 620 may amplify the first internal clock signal iWCK1/iWCK1B according to the power supply voltage VDD, and retransmit the amplified signal.

The repeater 620 may control swing width of its own output according to the first bias BIAS1.

The plurality of buffers 621 and 622 may transmit the output signal of the repeater 620 as the second internal clock signal iWCK2/iWCK2B to the local networks 202 and 320 through the global line GIO according to the power supply voltage VDD.

The plurality of buffers 621 and 622 may control swing width of the second internal clock signal iWCK2/iWCK2B according to the second bias voltage BIAS2.

As described above, the clock distribution circuit of the semiconductor device in accordance with an embodiment can provide the second bias voltage BIAS2 to logic circuits (the buffers 621 and 622 of the global distribution circuit 602) which transfer signals to the local region through the global line, among the logic circuits of the center region, provide the first bias voltage BIAS1 to the other logic circuits (the data clock generation circuit 601 and the repeater 620 of the global distribution circuit 602), and independently control the levels of the first and second bias voltages BIAS1 and BIAS2.

Figure 9:
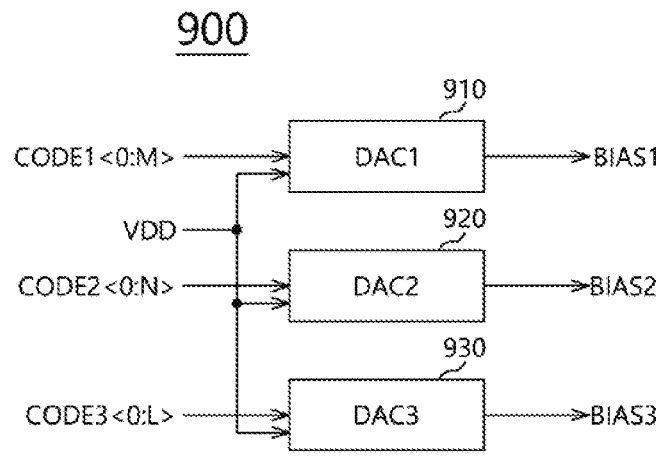
FIG. 9 illustrates the configuration of a bias distribution circuit of FIG. 2.

FIG. 9 illustrates the configuration of the bias generation circuit of FIG. 2.

Referring to FIG. 9, the bias generation circuit 900 may include a first digital-analog converter DAC1 910, a second digital-analog converter DAC2 920, and a third digital-analog converter DAC3 930.

The first digital-analog converter 910 may convert a digital signal or the first bias code CODE1<0:M> into an analog voltage or the first bias voltage BIAS1 according to the power supply voltage VDD.

The second digital-analog converter 920 may convert a digital signal or the second bias code CODE2<0:N> into an analog voltage or the second bias voltage BIAS2 according to the power supply voltage VDD.

The third digital-analog converter 930 may convert a digital signal or the third bias code CODE3<0:L> into an analog voltage or the third bias voltage BIAS3 according to the power supply voltage VDD.

The first to third bias voltages BIAS1 to BIAS3 may have independent or different levels or the same level, depending on the values of the first bias code CODE1<0:M>, the second bias code CODE2<0:N> and the third bias code CODE3<0:L>.

Since the plurality of buffers 621 and 622 transmit a signal from the center region to the local region through the global line GIO, the plurality of buffers 621 and 622 may require higher drivability than the other circuits of the center region. Therefore, the values of the first bias code CODE1<0:M> and the second bias code CODE2<0:N> may be set in such a manner that the second bias voltage BIAS2 provided to the plurality of buffers 621 and 622 has a higher level than the first bias voltage BIAS1.

Since the repeater 210 of the local network 202 among the logic circuits of the local region receives the clock signal at the CML level, the repeater 210 may independently control the level of the third bias voltage BIAS3 regardless of the first and second bias voltages BIAS1 and BIAS2. Depending on the circuit design and operation environment, the repeater 210 can control the third bias voltage BIAS3 to the same level as the first or second bias voltage BIAS1 or BIAS2.

As described above, the values of the first bias code CODE1<0:M>, the second bias code CODE2<0:N> and the third bias code CODE3<0:L> may be adjusted by the host 11.

The first to third digital-analog converters 910, 920 and 930 may be configured in the same manner. Therefore, the configuration of one of the first to third digital-analog converters 910, 920 and 930 will be representatively described.

Figure 10:
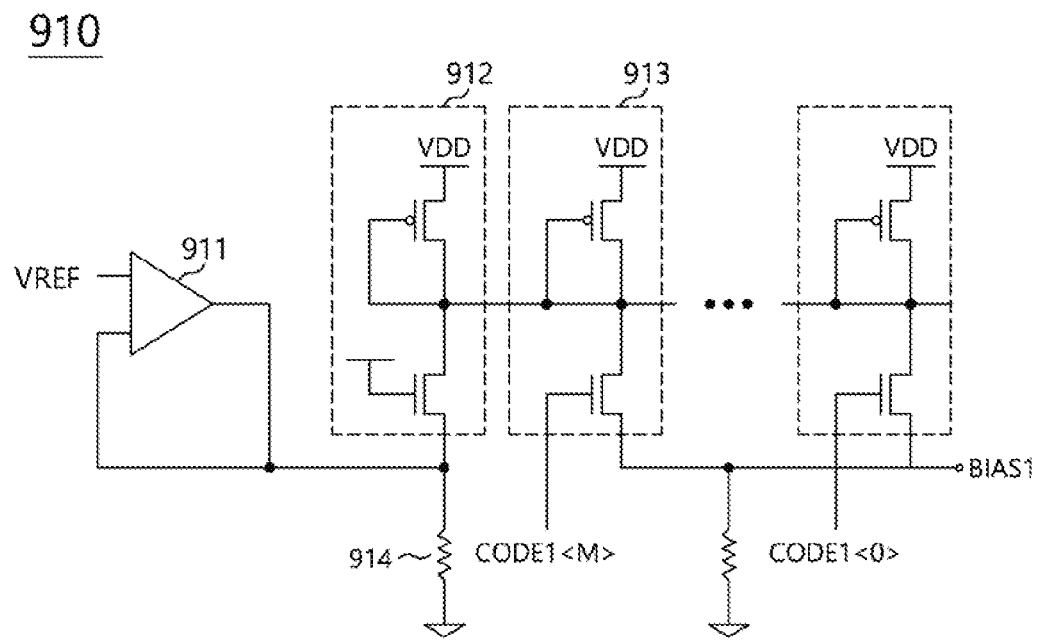
FIG. 10 illustrates the configuration of a first digital-analog converter of FIG. 9.

FIG. 10 illustrates the configuration of the first digital-analog converter of FIG. 9.

As illustrated in FIG. 10, the first digital-analog converter may include an amplifier 911, lag circuits 912 and 913 and resistors 914.

The lag circuits 912 and 913 may operate according to the power supply voltage VDD.

One of the lag circuits 912 and 913 may be basically set in an operation state regardless of the first bias code CODE1<0:M>, and thus referred to as a reference lag circuit.

The amplifier 911 may be operated to equalize an output level of the reference lag circuit 912 to a reference voltage VREF.

The other lag circuits 913 may be selectively operated according to the respective signal bits of the first bias code CODE1<0:M>, such that the first bias voltage BIAS1 has a value corresponding to the first bias code CODE1<0:M>.

While various embodiments have been described above, it will be understood to those skilled in the art that the embodiments described are examples only. Accordingly, the operating method of a data storage device described herein should not be limited based on the described embodiments.

What is claimed is:

1. A clock distribution circuit comprising:
   a data clock generation circuit configured to be input a power source voltage and configured to generate an internal clock signal according to an external clock signal; and
   a global distribution circuit includes a first circuit and a second circuit coupled to a global line, configured to receive the internal clock signal through the first circuit and distribute the internal clock signal to an exterior of the clock distribution circuit through the second circuit, wherein the first circuit is configured to be input with a first bias voltage and the power source voltage and the second circuit is configured to be input with a second bias voltage and the power source voltage, and wherein a level of the first bias voltage and a level of the second bias voltage are controlled independently of each other.

2. The clock distribution circuit of claim 1, wherein the data clock generation circuit is configured to generate the internal clock signal using the power source voltage and control swing width of the internal clock signal according to the first bias voltage.

3. The clock distribution circuit of claim 1, wherein the data clock generation circuit comprises:

a receiver configured to receive the power source voltage, the first bias voltage and the external clock signal and output the received signal; and a divider configured to be input the power source voltage and the first bias voltage and divide the output of the receiver and output the divided signal as a first internal clock signal.

4. The clock distribution circuit of claim 1, wherein the global distribution circuit is configured to receive the internal clock signal using the power source voltage and control swing width of a received signal according to the first bias voltage, wherein the global distribution circuit is configured to distribute the received signal using the power source voltage and control swing width of the received signal according to the second bias voltage.

5. The clock distribution circuit of claim 1, wherein the first circuit of the global distribution circuit includes a repeater configured to be input the power source voltage and the first bias voltage and retransmit the internal clock signal, and wherein the global distribution circuit includes one or more second circuits and the second circuits each include a buffer configured to be input the power source voltage and the second bias voltage and distribute the output signal of the repeater through the global line to the exterior of the clock distribution circuit.

6. The clock distribution circuit of claim 1 further comprising:

a bias generation circuit configured to generate the first and second bias voltages at independent levels using a power source voltage according to a plurality of bias codes.

7. The clock distribution circuit of claim 6, wherein the bias generation circuit comprises:

a first digital-analog converter configured to convert a first bias code into the first bias voltage using the power source voltage; and a second digital-analog converter configured to convert a second bias code into the second bias voltage using the power source voltage.

8. A semiconductor device comprising:

a clock distribution circuit including first and second circuits, configured to distribute an internal clock signal to global lines, the internal clock signal being generated based on an external clock signal;

a plurality of DQ arrays; and a plurality of local networks configured to be input the power source voltage and configured to distribute the internal clock signal transmitted through the global lines to the plurality of DQ arrays, wherein the first circuit is configured to be input with a first bias voltage and the power source voltage and the second circuit is configured to be input with a second bias voltage and the power source voltage, and wherein a level of the first bias voltage and a level of the second bias voltage are controlled independently of each other.

9. The semiconductor device of claim 8, wherein the second bias voltage provided to the second circuit directly coupled to the global lines of the clock distribution circuit, a third bias voltage provided to third circuits which are directly coupled to the global lines and included in the plurality of local networks, and the first bias voltage provided to the first circuit are controlled independently of each other.

10. The semiconductor device of claim 8, wherein the plurality of local networks convert the level of the internal clock signal into a CMOS (Complementary Metal-Oxide Semiconductor) level, and distribute the converted internal clock signal to the plurality of DQ arrays using the power source voltage, wherein the plurality of local networks are configured to control swing width of the converted internal clock signal according to a third bias voltage.

11. The semiconductor device of claim 8, wherein the plurality of DQ arrays and the plurality of local networks comprise CMOS circuits.

12. The semiconductor device of claim 8, wherein the clock distribution circuit comprises CML (Current Mode Logic) circuits.

13. The semiconductor device of claim 8, wherein the clock distribution circuit comprises:

a data clock generation circuit configured to be input the power source voltage and configured to generate the internal clock signal using the external clock signal, according to the first bias voltage;

a global distribution circuit configured to be input the power source voltage and configured to distribute the internal clock signal to the plurality of DQ arrays through the global lines, according to the first bias voltage and the second bias voltage; and a bias generation circuit configured to be input the power source voltage and configured to generate the first and second bias voltages and a third bias voltage at independent levels according to a plurality of bias codes.

14. The semiconductor device of claim 13, wherein the plurality of local networks comprise:

a repeater configured to amplify the internal clock signal according to the power source voltage and the third bias voltage, and retransmit the amplified signal;

a converter configured to convert the level of the output signal of the repeater into a CMOS level, and output the converted signal; and a clock distributor configured to distribute the output signal of the converter to the plurality of DQ arrays according to a read enable signal and a write enable signal.

15. The semiconductor device of claim 13, wherein the data clock generation circuit comprises:

a receiver configured to receive the external clock signal according to the power source voltage and the first bias voltage, and output the received signal; and a divider configured to divide the output of the receiver according to the power source voltage and the first bias voltage, and output the divided signal as a first internal clock signal.

16. The semiconductor device of claim 13, wherein the global distribution circuit includes the first and second circuits, the first circuit including a repeater configured to retransmit the internal clock signal according to the power source voltage and the first bias voltage, and the second circuit including a plurality of buffers configured to distribute the output signal of the repeater to the plurality of DQ arrays through the global lines according to the power source voltage and the second bias voltage.

17. The semiconductor device of claim 13, wherein the bias generation circuit comprises:
- a first digital-analog converter configured to convert a first bias code into the first bias voltage using the power source voltage; and
- a second digital-analog converter configured to convert a second bias code into the second bias voltage using the power source voltage.

18. The semiconductor device of claim 13, further comprising a mode register set configured to store the values of the plurality of bias codes.

19. The semiconductor device of claim 13, wherein the values of the plurality of bias codes are varied by a host which controls the semiconductor device.

* * * * *